United States Patent [19]
Wu

[11] Patent Number: 5,811,342
[45] Date of Patent: Sep. 22, 1998

[54] METHOD FOR FORMING A SEMICONDUCTOR DEVICE WITH A GRADED LIGHTLY-DOPED DRAIN STRUCTURE

[75] Inventor: Shye-Lin Wu, Hsinchu, Taiwan

[73] Assignee: Texas Instruments - Acer Incorporated, Hsinchu, Taiwan

[21] Appl. No.: 13,691

[22] Filed: Jan. 26, 1998

[51] Int. Cl.$^6$ .................................................. H01L 21/336
[52] U.S. Cl. .................. 438/303; 438/305; 438/595; 438/696; 438/965; 148/DIG. 106; 148/DIG. 161; 257/344; 257/335; 257/336; 257/900
[58] Field of Search .................................... 438/303, 305, 438/595, 696, 965, 204, 199, 193, 188; 148/DIG. 106, DIG. 161; 257/344, 335, 336, 900

[56] References Cited

U.S. PATENT DOCUMENTS

| | | | |
|---|---|---|---|
| 4,755,479 | 7/1988 | Miura | 438/303 |
| 4,837,179 | 6/1989 | Foster et al. | 438/305 |
| 4,948,744 | 8/1990 | Kita | 438/305 |
| 5,234,852 | 8/1993 | Liou | 438/303 |
| 5,428,240 | 6/1995 | Lur | 257/389 |
| 5,631,174 | 5/1997 | Iyer | 438/760 |

OTHER PUBLICATIONS

Ching-Yeu Wei et al., *Buried and Graded/Buried LDD Structures for Improved Hot-Electron Reliability*, 1986 IEEE, pp. 380–382.

Ryuichi Izawa et al., *The Impact of N-Drain Length and Gate-Drain/Source Overlap on Submicrometer LDD Devices for VLSI*, 1987 IEEE, pp. 480–482.

Shigeo Onishi et al., *A Mechanism of the Sidewall Process Induced Junction Leakage Current of LDD Structure*, J. Electrochem. Soc., vol. 138, No. 5, May 1991, pp. 1439–1443.

Y. Pan et al., *Hot-Carrier Induced Electron Mobility and Series Resistance Degradation in LDD NMOSFET's*, IEEE Electron Device Letters, vol. 15, No. 12, Dec. 1994, pp. 499–501.

*Primary Examiner*—M. Wilczewski
*Attorney, Agent, or Firm*—Harness, Dickey & Pierce, P.L.C.

[57] ABSTRACT

A method for forming a semiconductor device with a graded lightly-doped drain (LDD) structure is disclosed. The method includes providing a semiconductor substrate (10) having a gate region (14 and 16) thereon, followed by forming a pad layer (18) on the substrate and the gate region. Next, ions are implanted into the substrate, and a spacer (22) is formed on sidewalls of the gate region, wherein the first spacer has a concave surface inwards on a surface of the first spacer. Finally, ions are further implanted into the substrate using the gate region and the spacer as a mask, thereby forming a graded doping profile (20) in the substrate.

16 Claims, 2 Drawing Sheets

METHOD FOR FORMING A SEMICONDUCTOR DEVICE WITH A GRADED LIGHTLY-DOPED DRAIN STRUCTURE

BACKGROUND OF THE INVENTION

1. Field of the Invention

The present invention relates to a semiconductor transistor, and particularly, to a method for forming a metal-oxide-semiconductor field effect transistor (MOSFET) with a graded lightly-doped drain (LDD) structure.

2. Description of the Prior Art

As metal-oxide-semiconductor (MOS) devices are scaled down, short channel effect and hot carrier reliability problems become the major constrains. Most attempts to solve these problems have been discussed in references such as that disclosed by Ryuichi Izawa et al., "The Impact of N-Drain Length and Gate-Drain/Source Overlap on Submicrometer LDD Devices for VLSI," IEEE Electronic Device Letters, VOL. EDL-8, NO. 10, October 1987, pages 480–482, and that disclosed by Ching-Yeu Wei et al., "Buried and Graded/Buried LDD structures for Improved Hot-Electron Reliability," IEEE Electronic Device Letters, VOL. EDL-7, NO. 6, June 1986, pages 380–382 which are hereby incorporated by reference. In these references, their attempts have focused on reducing the lateral electric field strength by making the p-channel to n+ drain transition less abrupt, including the phosphorous source-drain junctions, the arsenic-phosphorous source-drain junction, and the lightly-doped drain (LDD) structure in conjunction with an oxide sidewall spacer.

However, the performance of the MOS devices is degraded in the LDD structure due to an increase in its series resistance, and due to a reduction of the carrier mobility in the channel and out diffusion regions, as discussed by Y. Pan et al., "Hot-Carrier Induced Electron Mobility and Series Resistance Degration in LDD NMOSFET's," IEEE Electronic Device Letters, VOL. 15, NO. 12, December 1994, pages 499–501 which is hereby incorporated by reference.

Another problem encountered in the MOS devices with LDD sidewall spacers is drain-to-substrate leakage caused by the crystalline defects at the sidewall edge. To solve this problem, a process is disclosed by Shigeo Onishi et al., "A Mechanism of the Sidewall Process Induced Junction Leakage Current of LDD Structure," J. Electrochem. Soc., VOL. 138, NO. 5, May 1991, pages 1439–1443 which is hereby incorporated by reference. In this reference, a smoothly shaped sidewall is formed by an anisotropic and a subsequent isotropic etch, effectively suppressing the defects.

SUMMARY OF THE INVENTION

In accordance with the present invention, a method is provided for forming a MOSFET with a graded lightly-doped drain (LDD) structure. In one embodiment, a semiconductor substrate is provided which has a gate region formed thereon. Next, a silicon nitride layer is formed on the substrate and the gate region, and ions are then implanted into the substrate. A spin-on-glass film is coated over the silicon nitride layer, followed by reflowing the spin-on-glass film, and etching back the spin-on-glass film to form a first spacer on sidewalls of the gate region, wherein the first spacer has a concave surface inwards on a surface of the first spacer. Ions are further implanted into the substrate through the silicon nitride layer using the gate region and the first spacer as a mask, thereby forming a graded doping profile in the substrate. After removing the first spacer and the silicon nitride layer, a dielectric layer is deposited over the gate region and the substrate, followed by etching back the dielectric layer, thereby forming a second spacer on sidewalls of the gate region. Finally, the substrate is annealed to smooth the graded doping profile in the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
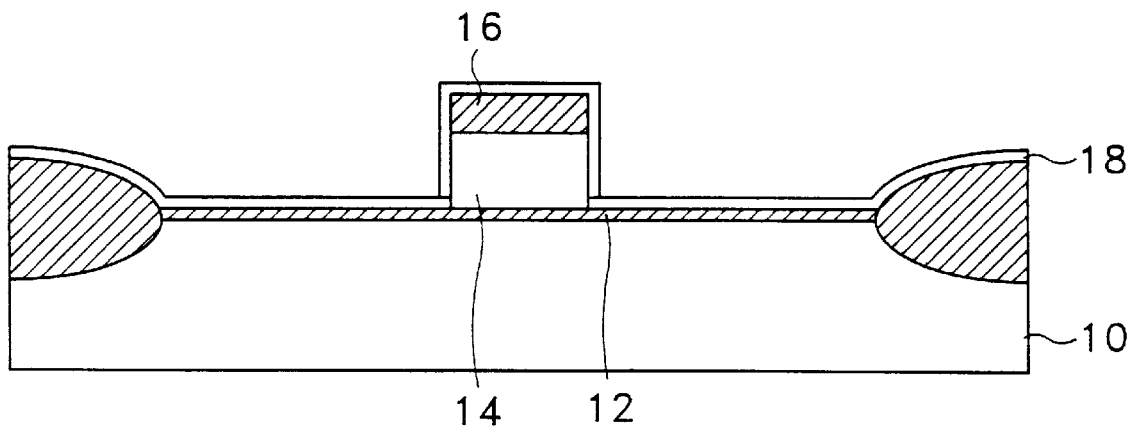
FIGS. 1–6 show cross-sectional views illustrative of various stages in the fabrication of a MOSFET with a graded lightly-doped drain (LDD) structure in accordance with the present invention.

FIG. 1 shows a cross-sectional view illustrative of a semiconductor substrate 10 and a thin gate oxide layer 12 formed thereon. On the gate oxide layer 12 is a polysilicon gate region, which includes a polysilicon region 14 and a silicon oxide region 16 (such as TetraEthOxySilane, TEOS) formed on the polysilicon region 14. Next, a dielectric layer 18, such as a silicon nitride layer, used as a pad layer, is then deposited over the gate region and the substrate 10. In this embodiment, the silicon nitride layer 18 is deposited using a conventional low pressure chemical vapor deposition (LPCVD) or plasma enhanced chemical vapor deposition (PECVD) to a thickness of about 50–300 angstroms.

Figure 2:
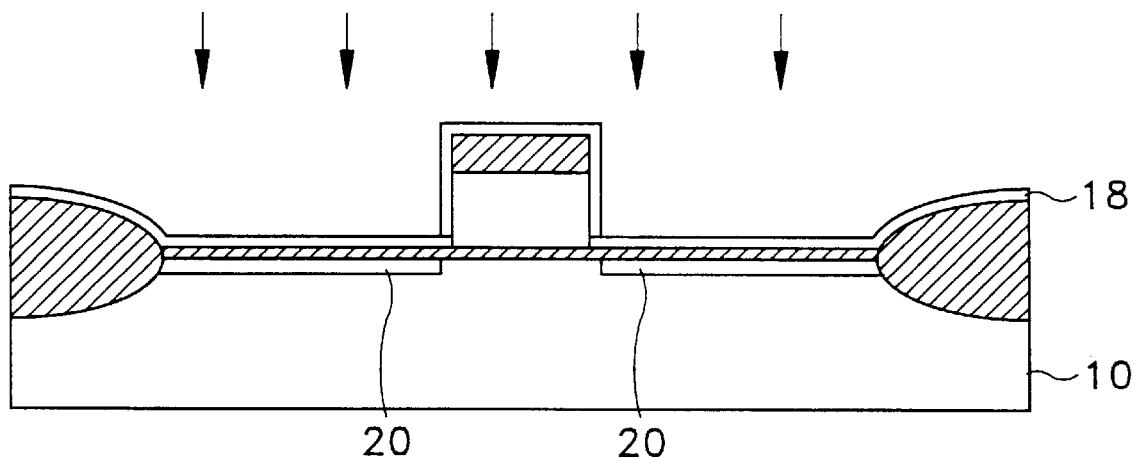

In FIG. 2, a low dose (about $5 \times 10^{12} - 5 \times 10^{14}$ atoms/cm$^2$) and low energy (about 5–100 keV) lightly-doped drain (LDD) implant is performed to the substrate 10 via the silicon nitride layer 18, resulting in the source/drain region 20 as shown in FIG. 2.

Figure 3:
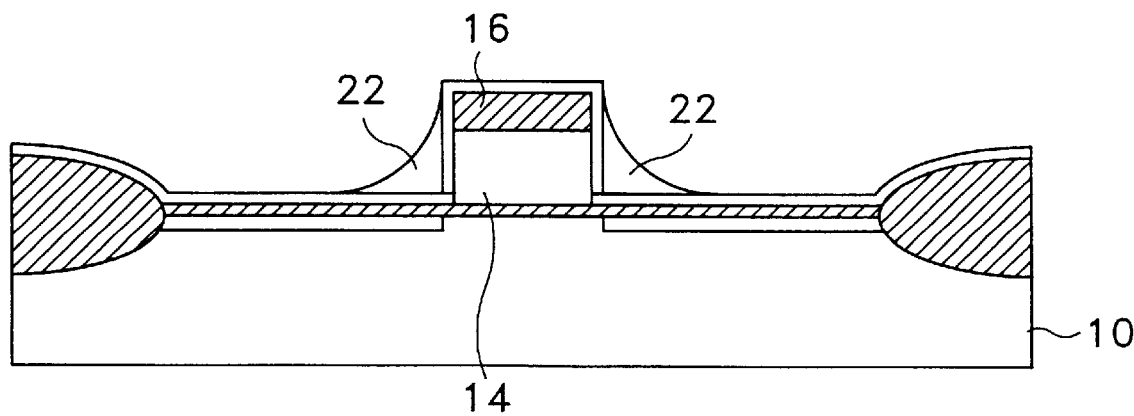

Referring to FIG. 3, a sloping spacer 22 is formed on the sidewall of the gate region (14 and 16). This spacer 22 has a concave surface inwards in the middle on the surface of the spacer 22. In this embodiment, this spacer 22 is formed by firstly coating a thick spin-on-glass (SOG) film, followed by a standard reflowing process and then etching back the spin-on-glass (SOG) film.

Figure 4:
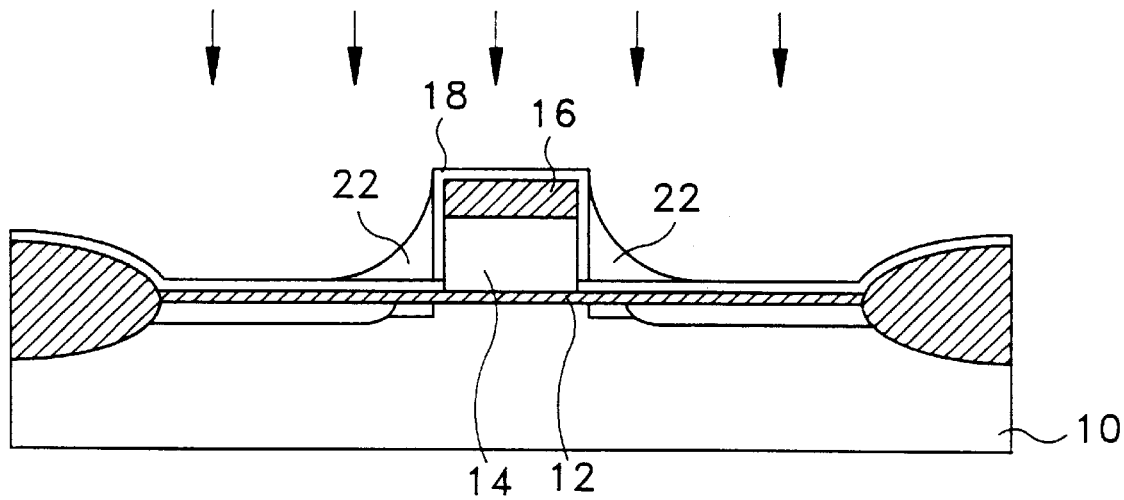

Next, a second implant is performed through the slopping spacer 22 and the silicon nitride layer 18, resulting in a graded doping profile in the substrate 10 as shown in FIG. 4. It is noted that this graded profile substantially reduces junction leakage caused by the crystalline defects at the sidewall edge.

Subsequently, the SOG spacer 22 is removed, for example, by HF solution, wherein the silicon nitride layer 18 acts as a mask to the substrate 10, the gate oxide layer 12 and the gate region (14 and 16). Further, the silicon nitride layer 18 is then removed, for example, by H$_3$PO$_4$ solution.

Figure 5:
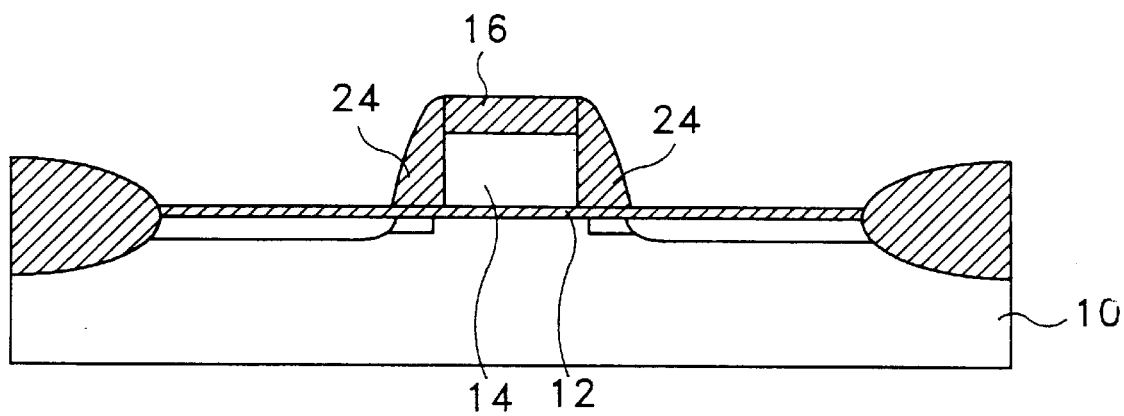
Figure 6:
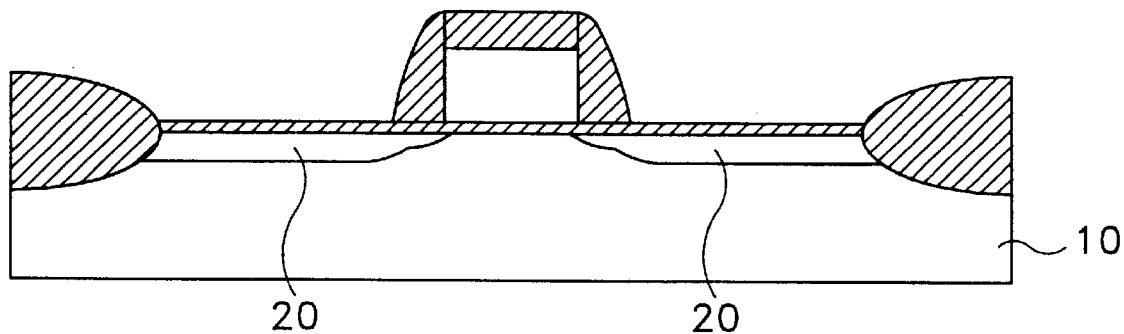

Another dielectric spacer 24 is further formed on the sidewalls of the gate region (14 and 16) as shown in FIG. 5. In this embodiment, this dielectric spacer 24 is formed by firstly depositing a dielectric layer 24, such as a silicon oxide layer or a silicon nitride layer, on the gate region (14 and 160) and the gate oxide layer 12, followed by etching back this dielectric layer 24.

To complete the present invention, the substrate 10 is subjected under a high temperature (about 700°–1150° C.)

thermal anneal to form shallow source/drain 20 junction, which has a smoothly gradual doping profile. According to the present invention, conventional problems, such as series resistance, hot channel effect, and junction leakage, could be substantially improved.

Although specific embodiments have been illustrated and described, it will be obvious to those skilled in the art that various modifications may be made without departing from the spirit which is intended to be limited solely by the appended claims.

What is claimed is:

1. A method for forming a graded lightly-doped drain structure in a semiconductor device, said method comprising:

providing a semiconductor substrate having a gate region thereon;

forming a pad layer on said substrate and said gate region;

implanting ions into said substrate;

forming a spacer on sidewalls of said gate region, said spacer having a concave surface inwards on a surface of said spacer; and implanting ions into said substrate using the gate region and the spacer as a mask, thereby forming a graded doping profile in said substrate.

2. The method according to claim 1, wherein said gate region comprises a polysilicon region formed on said substrate, and a silicon oxide region formed on said polysilicon region.

3. The method according to claim 1, wherein said spacer is formed by the steps of:

coating a spin-on-glass film over said pad layer;

reflowing said spin-on-glass film; and etching back said spin-on-glass film, thereby forming said spacer.

4. The method according to claim 1, wherein said pad layer comprises silicon nitride.

5. A method for forming a semiconductor device with a graded lightly-doped drain structure, said method comprising:

providing a semiconductor substrate having a gate region thereon;

forming a pad layer on said substrate and said gate region;

implanting ions into said substrate;

forming a first spacer on sidewalls of said gate region, said first spacer having a concave surface inwards on a surface of said first spacer;

implanting ions into said substrate using the gate region and the first spacer as a mask, thereby forming a graded doping profile in said substrate;

removing said first spacer and said pad layer; and forming a second spacer on the sidewalls of said gate region.

6. The method according to claim 5, further comprising annealing said substrate, thereby smoothing said graded doping profile in said substrate.

7. The method according to claim 5, wherein said gate region comprises a polysilicon region formed on said substrate, and a silicon oxide region formed on said polysilicon region.

8. The method according to claim 5, wherein said pad layer comprises silicon nitride.

9. The method according to claim 5, wherein said first spacer is formed by the steps of:

coating a spin-on-glass film over said pad layer;

reflowing said spin-on-glass film; and etching back said spin-on-glass film, thereby forming said first spacer.

10. The method according to claim 5, wherein said second spacer is formed by the steps of:

depositing a dielectric layer over said gate region and said substrate; and etching back said dielectric layer, thereby forming said second spacer.

11. The method according to claim 5, wherein said second spacer comprises silicon oxide.

12. The method according to claim 5, wherein said second spacer comprises silicon nitride.

13. A method for forming a semiconductor device with a graded lightly-doped drain structure, said method comprising:

providing a semiconductor substrate having a gate region thereon;

forming a silicon nitride layer on said substrate and said gate region;

implanting ions into said substrate;

coating a spin-on-glass film over said silicon nitride layer;

reflowing said spin-on-glass film;

etching back said spin-on-glass film to forming a first spacer on sidewalls of said gate region, said first spacer having a concave surface inwards on a surface of said first spacer;

implanting ions into said substrate through said silicon nitride layer using the gate region and the first spacer as a mask, thereby forming a graded doping profile in said substrate;

removing said first spacer and said silicon nitride layer;

depositing a dielectric layer over said gate region and said substrate;

etching back said dielectric layer, thereby forming a second spacer on the sidewalls of said gate region; and annealing said substrate, thereby smoothing said graded doping profile in said substrate.

14. The method according to claim 13, wherein said gate region comprises a polysilicon region formed on said substrate, and a silicon oxide region formed on said polysilicon region.

15. The method according to claim 13, wherein said dielectric layer comprises silicon nitride.

16. The method according to claim 13, wherein said dielectric layer comprises silicon oxide.

* * * * *